(12) United States Patent
Schuller

(10) Patent No.: US 6,718,300 B1
(45) Date of Patent: Apr. 6, 2004

(54) METHOD AND APPARATUS FOR REDUCING ALIASING IN CASCADED FILTER BANKS

(75) Inventor: Gerald Dietrich Schuller, Chatham, NJ (US)

(73) Assignee: Agere Systems Inc., Allentown, PA (US)

( * ) Notice: Subject to any disclaimer, the term of this patent is extended or adjusted under 35 U.S.C. 154(b) by 697 days.

(21) Appl. No.: 09/586,069

(22) Filed: Jun. 2, 2000

(51) Int. Cl.$^7$ .............................................. G10L 19/14
(52) U.S. Cl. ........................ 704/226; 704/205; 708/313; 708/402
(58) Field of Search ............................. 704/200, 200.1, 704/203–206, 224–231, 233, 234, 500; 341/144, 143, 61; 375/240; 708/313, 402

(56) References Cited

U.S. PATENT DOCUMENTS

| | | | | |
|---|---|---|---|---|
| 5,436,940 A | * | 7/1995 | Nguyen ...................... | 704/231 |
| 5,606,319 A | * | 2/1997 | Yatim et al. ................ | 341/144 |
| 5,852,806 A | * | 12/1998 | Johnston et al. ............ | 704/230 |
| 6,029,126 A | * | 2/2000 | Malvar ....................... | 704/204 |
| 6,144,937 A | * | 11/2000 | Ali .............................. | 704/226 |

OTHER PUBLICATIONS

B. Edler, "Aliasing Reduction in Subbands of Cascaded Filter Banks with Decimation," Electronics Letters, vol. 28, No. 12, 1104–1105 (Jun. 1992).

* cited by examiner

Primary Examiner—David D. Knepper
(74) Attorney, Agent, or Firm—Ryan, Mason & Lewis, LLP

(57) ABSTRACT

A method and apparatus are disclosed for reducing aliasing between neighboring subbands in cascaded filter banks. An alias reduction filter bank is included to reduce the aliasing components between different subbands. Generally, the magnitude response and phase of the alias reduction filter bank is similar to the magnitude response of the synthesis filter bank of the first stage filter bank. The alias reduction filter bank filters and adds the signals from a set of $M_2$ subbands from the $M_1$ subbands of the first stage analysis filter bank. A higher frequency resolution is obtained after the alias reduction stage by a following analysis filter bank. The signals of these subbands are first fed into an alias reduction filter bank to reduce the aliasing. If the first stage filter bank is a modulated uniform filter bank with $M_1$ bands, and the stage for alias reduction has $M_2$ bands, then to obtain alias cancellation, the alias reduction filter bank has to have a similar frequency response as the synthesis filter bank for the first stage, but with the frequency scaled by the ratio of the sampling rates, $M_1/M_2$. After the alias reduction filter stage, an analysis filter bank to obtain a higher frequency resolution follows. A synthesis filter bank for the first stage analysis filter bank can be "thinned out" by keeping only every $M_1/M_2{}^{th}$ substructure to obtain the alias reduction filter bank.

20 Claims, 4 Drawing Sheets

100

400

METHOD AND APPARATUS FOR REDUCING ALIASING IN CASCADED FILTER BANKS

CROSS-REFERENCE TO RELATED APPLICATIONS

The present invention is related to U.S. patent application Ser. No. 09/586,072, entitled "Perceptual Coding of Audio Signals Using Separated Irrelevancy Reduction and Redundancy Reduction," U.S. patent application Ser. No. 09/586,071, entitled "Method and Apparatus for Representing Masked Thresholds in a Perceptual Audio Coder," U.S. patent application Ser. No. 09/586,070, entitled "Perceptual Coding of Audio Signals Using Cascaded Filterbanks for Performing Irrelevancy Reduction and Redundancy Reduction With Different Spectral/Temporal Resolution," and U.S. patent application Ser. No. 09/586,068, entitled "Method and Apparatus for Detecting Noise-Like Signal Components," filed contemporaneously herewith, assigned to the assignee of the present invention and incorporated by reference herein.

FIELD OF THE INVENTION

The present invention relates generally to cascaded filter banks, and more particularly, to methods and apparatus for reducing the aliasing in such cascaded filter banks.

BACKGROUND OF THE INVENTION

In signal compression applications, a filter bank with unequal band splitting is often desired to obtain the maximum coding gain. In audio coding applications, for example, band splitting also determines how well the time and frequency shape of the quantization noise after the signal has been decoded is matched to the psycho-acoustic audibility threshold. See, for example, D. Sinha et al., "The Perceptual Audio Coder," Digital Audio, Section 42, 42-1 to 42-18, (CRC Press, 1998), incorporated by reference herein.

To obtain such unequal band splitting, tree structures are often used. A tree structure may implement, for example, wavelet transforms, such as those described in M. Vetterli & J. Kovacevic, "Wavelets and Subband Coding," Prentice Hall (1995), where one or more frequency bands 120, 130, such as the lower frequency band 120, is further split into additional subbands 140-1 through 140-3, as shown in FIG. 1. Other approaches take a uniform filter bank and join several subbands into one wider band to increase bandwidth, such as described in H. S. Malvar, "Lapped Biorthogonal Transforms for Transform Coding with Reduced Blocking and Ringing Artifacts," International Conference on Acoustics, Speech, and Signal Processing, Munich, Germany, 2421–2424, (1997). Another approach joins several pieces of different uniform filter banks using transition filters, such as described in J. Princen & J. D. Johnston, "Audio Coding with Signal Adaptive Filterbanks," ICASSP, Detroit, Mich., 3071–3074, (1995).

A cascaded filter bank, such as the cascaded filter bank 100 shown in FIG. 1, has different filter banks 110, 160 following each other to obtain different frequency and time resolutions. The problem with a cascaded filter bank 100 is that the filters are not perfect, and hence the downsampling after each subband filter leads to aliasing. Aliasing occurs when signals with energy outside the filter passband are "mirrored" into the passband of the filter.

If this mirrored signal is in the passband of the following filter, the attenuation of the signal is determined only by the first filter of the cascade. This leads to a poor frequency selectivity of the combined filter bank. FIG. 2 displays the magnitude response 200 of a particular band of a filter bank consisting of a cascade with 128 bands in the first stage and 8 bands in the following stage, for a total of 1024 bands, if all subbands of the first stage are split. The aliasing is manifested in the magnitude response 200 as high peaks other than the main lobe, partly with less than 10 dB attenuation. As a comparison, the desired magnitude response 300 can be seen in FIG. 3, which shows a particular band of a 1024 band uniform filter bank.

An approach to reduce this type of aliasing has been incorporated into the MPEG1/Layer 3 audio coder, described in Madisetti & D. B. Williams, eds., "The Digital Signal Processing Handbook," CRC Press, IEEE Press, Boca Raton, Fla. (1997), incorporated by reference herein. The MPEG-1/Layer 3 audio coder uses a cascaded filter bank, with 32 bands in the first stage and 6 or 18 bands (switchable) in the second stage. For this special type of filter bank, a butterfly like structure is used at the output of the second stage to reduce the aliasing between adjacent bands. See, for example, B. Edler, "Aliasing Reduction in Subbands of Cascaded Filter Banks with Decimation," Electronics Letters, Vol. 28, No. 12, pp. 1104–1105, June 1992, incorporated by reference herein.

While the alias reduction techniques incorporated in the MPEG-1/Layer 3 audio coder works for reducing the aliasing in neighboring bands, it only reduces the aliasing from one neighbor, and only in specific filter banks, where the aliasing of neighboring bands has a phase shift of 180 degrees. A need exists for a method and apparatus that reduce aliasing on more than one neighboring band, so that a fixed phase relationship is not required.

SUMMARY OF THE INVENTION

Generally, a method and apparatus are disclosed for reducing aliasing between neighboring subbands in cascaded filter banks. According to the present invention, a higher frequency resolution is obtained from a set of subbands. The signals of these subbands are first fed into an alias reduction filter bank to reduce the aliasing. If the first stage filter bank is a modulated uniform filter bank with $M_1$ bands, and the alias reduction filter bank has $M_2$ bands, then to obtain alias cancellation, the alias reduction filter bank has to have the same frequency response as the synthesis filter bank for the first stage, but with the frequency scaled by the ratio of the sampling rates, $M_1/M_2$. After the alias reduction filter stage, an analysis filter bank to obtain a higher frequency resolution follows.

According to a further aspect of the invention, a synthesis filter bank for a first stage analysis filter bank can be "thinned out" by keeping only every $M_1/M_2^{th}$ sub-structure. In one disclosed implementation, a two band alias reduction filter is generated from a four band synthesis filter bank with reduced aliasing. The resulting two band filter bank has similar frequency responses (up to the scaling) as the four band filter bank, and hence can be used for the alias reduction.

A more complete understanding of the present invention, as well as further features and advantages of the present invention, will be obtained by reference to the following detailed description and drawings.

DETAILED DESCRIPTION

Figure 4:
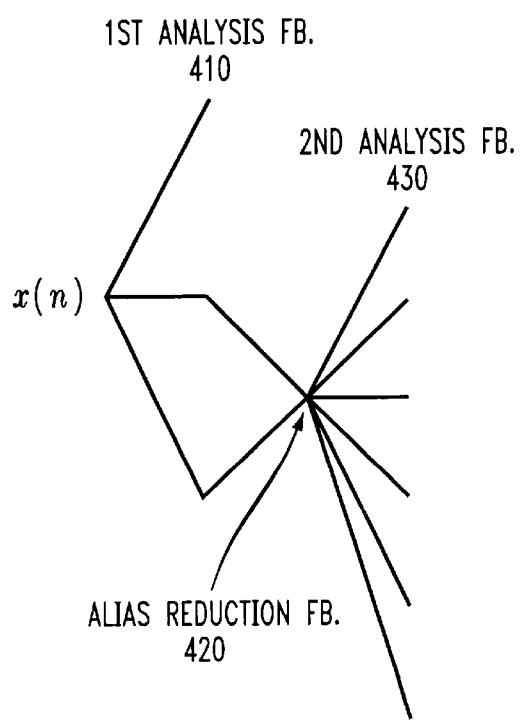
FIG. 4 illustrates a cascaded filter bank in accordance with the present invention.

FIG. 4 illustrates a cascaded filter bank 400 in accordance with the present invention. According to one feature of the present invention, the cascaded filter bank 400 includes an alias reduction filter bank 420 for a first analysis filter bank 410. As discussed further below, the alias reduction filter bank 420 obtains reduction of the aliasing by canceling the aliasing components between different filters by suitable filter design and adding all signals at the output stage of the synthesis filter bank.

The techniques of the present invention can be used to cancel or reduce the aliasing between neighboring subbands. To obtain a higher frequency resolution from a set of subbands, the signals of these subbands are first fed into an alias reduction filter bank, such as the alias reduction filter bank 420, for the reduction of the aliasing. If the first stage filter bank 410 is a modulated uniform filter bank with $M_1$ bands, and the alias reduction filter bank 420 has $M_2$ bands, then to obtain alias cancellation, the alias reduction filter bank 420 has to have the same frequency response as the synthesis filter bank (not shown) for the first stage, but with the frequency scaled by the ratio of the sampling rates, $M_1/M_2$. In other words, the second stage alias reduction filter bank 420 should have a window function or baseband prototype filter with a frequency response identical to the low frequency part of the prototype of the synthesis (not shown) of the first stage. After the alias reduction filter stage 420 for the aliasing reduction, an analysis filter bank 430 to obtain a higher frequency resolution follows, as shown in FIG. 4.

Generally, the magnitude response and phase of the alias reduction filter bank 420 should be similar to the magnitude response of the synthesis filter bank (not shown) in the first stage filter bank 410.

It is noted that any cosine modulated filter bank can be represented by a formulation using Zero-Delay and Maximum-Delay matrices, as described in G. Schuller & T. Karp, "Modulated Filter Banks with Arbitrary System Delay: Efficient Implementations and the Time-Varying Case," Trans. on Signal Processing, V. 48, No. 3 (March, 2000), incorporated by reference herein. This leads to a structure, which consists of nested two band sub-structures.

Figure 5:
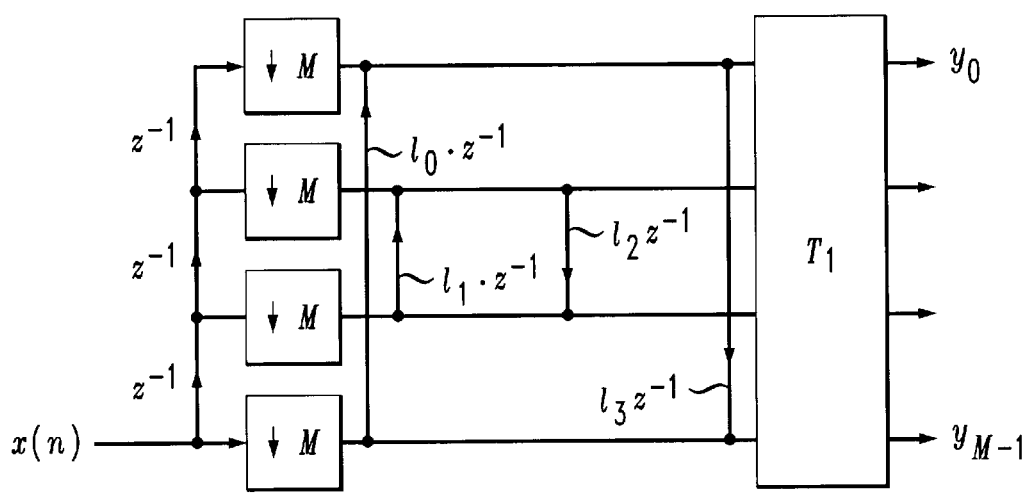
FIG. 5 illustrates a four band analysis filter bank suitable for use in the cascaded filter bank of FIG. 4.
Figure 6:
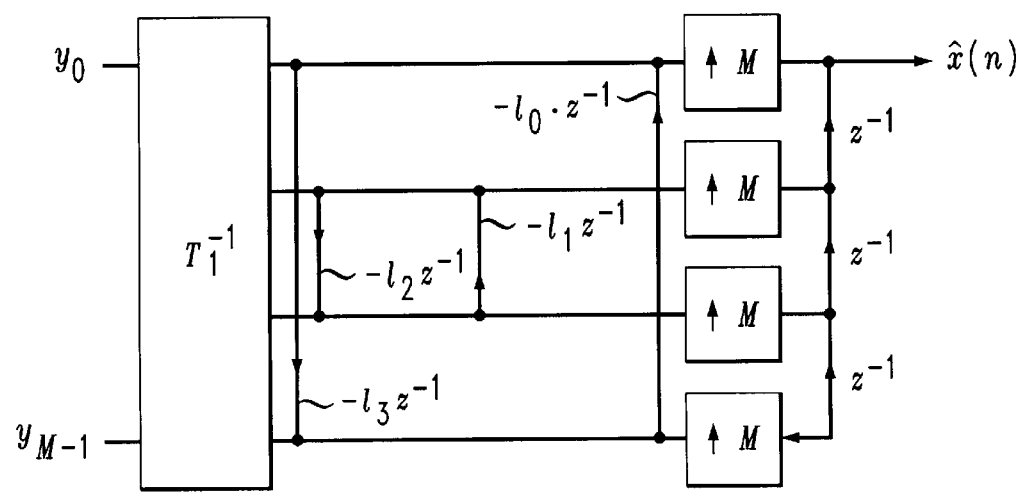
FIG. 6 illustrates a four band synthesis filter bank with reduced aliasing.

FIG. 5 shows an example for a four band filter bank 500, and FIG. 6 shows the corresponding four band synthesis filter bank 600 with reduced aliasing. $T_1$ is an $M_1 \cdot M_1$ Discrete Cosine Transfom (DCT) type 4, in this case, having a size $4 \cdot 4$, and $T_1^{-1}$ is an $M_1 \cdot M_1$ Inverse Discrete Cosine Transfom (IDCT) type 4, in this case, having a size $4 \cdot 4$. See, G. Schuller & T. Karp, referenced above.

Figure 7:
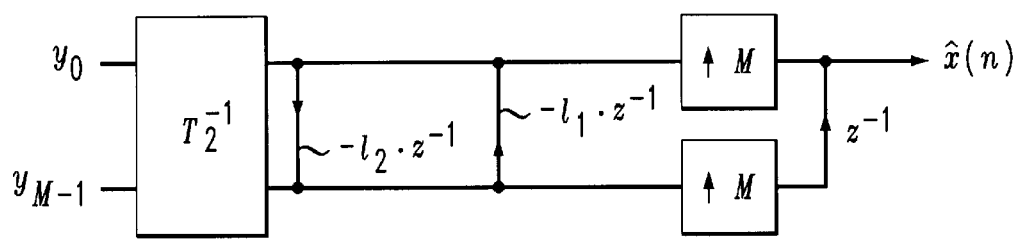
FIG. 7 shows a four band synthesis filter bank generated from the four band synthesis filter bank of FIG. 6 in accordance with the present invention.

Once a first stage filter bank is initially designed, the structure of its corresponding synthesis filter bank with reduced aliasing can be "thinned out" by keeping only every $M_1/M_2^{th}$ sub-structure. For example, FIG. 7 shows a two band alias reduction filter 700 generated from the four band synthesis filter bank 600 of FIG. 6. In FIG. 7, $T_2$ is a $2 \cdot 2$ DCT. The resulting two band filter bank has similar frequency responses (up to the scaling), and hence can be used for the alias reduction.

The values 1 of the structure determine the resulting window function or baseband prototype of the filter bank. Since this smaller filter bank is obtained by "downsampling" the structure, its window function is obtained by downsampling the window function of the first stage filter bank in a certain way. Since the sub-structures are symmetric around the center of a block of length $M_1$, the resulting downsampling of the window function appears in an analog fashion, downsampling each interval of length $M_1$ of the window function symmetric around each intervals center. For example, assume the first stage filter bank has four bands ($M_1$ equals 4), and its window function has the form:

1, 2, 3, 4, 4, 3, 2, 1

If the second stage for alias cancellation is to have two bands, the window function of the second stage can be obtained by symmetric downsampling in each block of four samples, as in the following:

2, 3, 3, 2

Since the structural formulation is valid for all cosine modulated filter banks with reduced aliasing, this downsampling rule is also valid for these types of filter banks. In other words, if a filter bank and a window function is given for the first stage, the window function obtained by this non-uniform symmetric downsampling automatically leads to a filter bank with reduced aliasing, and it also reduces the aliasing after the first stage.

Figure 1:
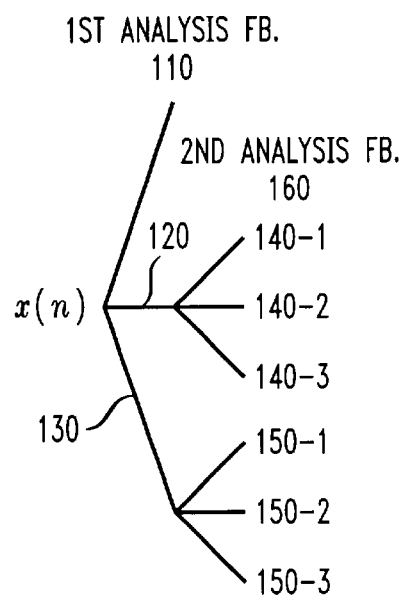
FIG. 1 illustrates a conventional cascaded filter bank having different filter banks following each other to obtain different frequency and time resolutions.
Figure 2:
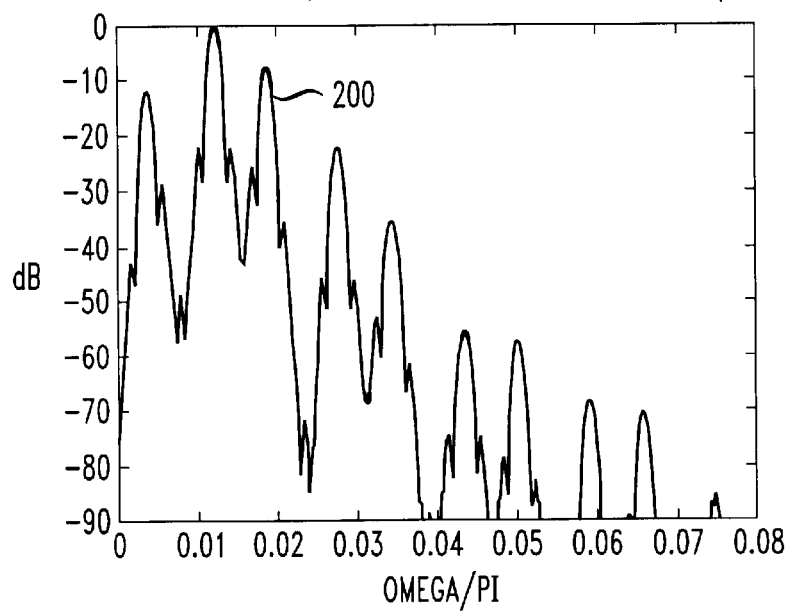
FIG. 2 illustrates the aliasing in the magnitude response of a particular band of a conventional filter bank
Figure 3:
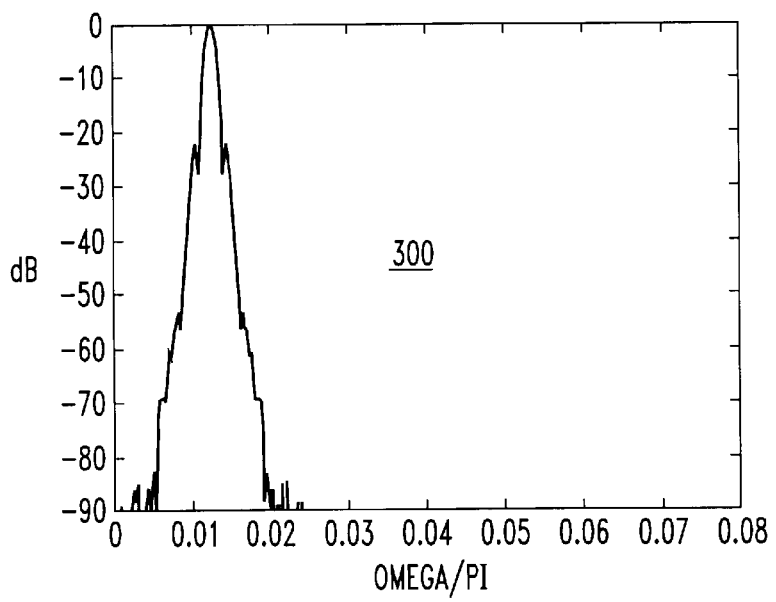
FIG. 3 illustrates the magnitude response with no aliasing from cascading in a uniform non-cascaded filter bank.

This method is illustrated with the following example. The goal in this example is to obtain a resolution of 128 (uniform) bands in the first stage and a resolution of 1024 bands in the final stage. FIG. 3 shows an enlargement of a particular band of a uniform 1024 band filter bank, without cascading. With the stacked cascaded filter bank, the goal is a frequency response similar to this after the final stage. FIG. 2 shows an enlargement of the same channel but for a traditional cascaded filter bank, with 128 bands in the first stage and 8 bands following in each subband in the next stage. The aliasing is easy to see as the high peaks, other than the main lobe.

To reduce the aliasing, the structure of a 128 band alias reduction filter bank is "downsampled" to obtain an eight band alias reduction filter bank for reducing the aliasing across eight neighboring bands. This downsampling leads to a structure with a 128 band analysis filter bank in the first stage, followed by an eight band alias reduction filter bank for alias reduction in the second stage, followed by a 64 band analysis filter bank in the final stages. The overall alias reduction filter bank for this structure contains the reverse steps.

It is to be understood that the embodiments and variations shown and described herein are merely illustrative of the principles of this invention and that various modifications may be implemented by those skilled in the art without departing from the scope and spirit of the invention.

I claim:

1. A method for reducing aliasing between neighboring subbands in a cascaded filter bank, comprising the steps of:

filtering a signal to produce a plurality of frequency components using a plurality of subbands in a first filter bank;

adding said frequency components using an alias reduction filter bank at an output of said subbands in said first filter bank; and filtering said added frequency components using a plurality of subbands in a second filter bank.

2. The method of claim 1, wherein the magnitude response of said alias reduction filter bank is approximately equal to a magnitude response of a synthesis filter bank of the first filter bank.

3. The method of claim 1, wherein the phase characteristics of said alias reduction filter bank is approximately equal to a magnitude response of a synthesis filter bank of the first filter bank.

4. The method of claim 1, wherein said plurality of subbands in said first filter bank comprise $M_1$ bands, and said alias reduction filter bank has $M_2$ bands and said alias reduction filter bank has a frequency response approximately equal to the frequency response of a synthesis filter bank in said first filter bank scaled by the ratio of $M_1/M_2$.

5. The method of claim 1, wherein said alias reduction filter bank is a cosine modulated filter bank and contains only every $M_1/M_2{}^{th}$ sub-structure.

6. A cascaded filter bank, comprising:

a first filter bank comprised of a plurality of subbands for filtering a signal into a plurality of frequency components;

an alias reduction filter bank at an output of said first filter bank, said alias reduction filter bank adding said frequency components; and a second filter bank connected to said alias reduction filter, said second filter bank comprised of a plurality of subbands for filtering said frequency components produced by said alias reduction filter bank.

7. The cascaded filter bank of claim 6, wherein the magnitude response of said alias reduction filter bank is approximately equal to a magnitude response of a synthesis filter bank of the first filter bank.

8. The cascaded filter bank of claim 6, wherein the phase characteristics of said alias reduction filter bank is approximately equal to a magnitude response of a synthesis filter bank of the first filter bank.

9. The cascaded filter bank of claim 6, wherein said plurality of subbands in said first filter bank comprise $M_1$ bands, and said alias reduction filter bank has $M_2$ bands and said alias reduction filter bank has a frequency response approximately equal to the frequency response of a synthesis filter bank in said first filter bank scaled by the ratio of $M_1/M_2$.

10. The cascaded filter bank of claim 6, wherein said alias reduction filter bank is a cosine modulated filter bank and contains only every $M_1/M_2{}^{th}$ sub-structure.

11. A method for reducing aliasing between neighboring subbands in a cascaded filter bank, comprising the steps of:

filtering a signal using a first filter bank to produce $M_1$ subbands;

adding $M_2$ subbands of said $M_1$ subbands using an alias reduction filter bank; and filtering said added $M_2$ subbands using a plurality of subbands in a second filter bank.

12. The method of claim 11, wherein the magnitude response of said alias reduction filter bank is approximately equal to a magnitude response of a synthesis filter bank of the first filter bank.

13. The method of claim 11, wherein the phase characteristics of said alias reduction filter bank is approximately equal to a magnitude response of a synthesis filter bank of the first filter bank.

14. The method of claim 11, wherein said alias reduction filter bank has a frequency response approximately equal to the frequency response of a synthesis filter bank in said first filter bank scaled by the ratio of $M_1/M_2$.

15. The method of claim 11, wherein said alias reduction filter bank is a cosine modulated filter bank and contains only every $M_1/M_2{}^{th}$ sub-structure.

16. A cascaded filter bank, comprising:

a first filter bank for filtering a signal into $M_1$ subbands;

an alias reduction filter bank for adding $M_2$ subbands of said $M_1$ subbands; and a second filter bank for filtering said $M_2$ subbands produced by said alias reduction filter bank.

17. The cascaded filter bank of claim 16, wherein the magnitude response of said alias reduction filter bank is approximately equal to a magnitude response of a synthesis filter bank of the first filter bank.

18. The cascaded filter bank of claim 16, wherein the phase characteristics of said alias reduction filter bank is approximately equal to a magnitude response of a synthesis filter bank of the first filter bank.

19. The cascaded filter bank of claim 16, wherein said plurality of subbands in said first filter bank comprise $M_1$ bands, and said alias reduction filter bank has $M_2$ bands and said alias reduction filter bank has a frequency response approximately equal to the frequency response of a synthesis filter bank in said first filter bank scaled by the ratio of $M_1/M_2$.

20. The cascaded filter bank of claim 16, wherein said alias reduction filter bank is a cosine modulated filter bank and contains only every $M_1/M_2{}^{th}$ sub-structure.

* * * * *